United States Patent [19]

Capstick

[11] 3,875,478

[45] Apr. 1, 1975

[54] SEMICONDUCTOR DEVICE ARRANGEMENTS

[75] Inventor: John Capstick, Southampton, England

[73] Assignee: U.S. Philips Corporation, New York, N.Y.

[22] Filed: Jan. 12, 1973

[21] Appl. No.: 323,204

[30] Foreign Application Priority Data

| | | |
|---|---|---|
| Jan. 12, 1972 | United Kingdom | 1390/72 |
| May 5, 1972 | United Kingdom | 21029/72 |

[52] U.S. Cl..... 317/101 CC, 317/100, 317/101 CM, 357/80, 357/81

[51] Int. Cl. .... A05k 5/00

[58] Field of Search...... 317/101 CC, 101 F, 234 A, 317/234 G, 100; 174/DIG. 3

[56] References Cited

UNITED STATES PATENTS

| | | | |
|---|---|---|---|
| 3,323,022 | 5/1967 | DeCosta | 317/234 G |
| 3,325,704 | 6/1967 | Belasco et al. | 317/234 A |
| 3,390,308 | 6/1968 | Marley | 317/100 |
| 3,662,230 | 5/1972 | Redwantz | 174/DIG. 3 |

*Primary Examiner*—David Smith, Jr.
*Attorney, Agent, or Firm*—Frank R. Trifari

[57] ABSTRACT

A semiconductor device for face-bonding on a circuit. The chip is enveloped between a carrier plate and a laminated conductor foil. Conductors of the foil are secured to top electrodes of the chip. Conductive edges of the foil are folded back to provide remote from the plate device-terminal areas for direct connection to contact areas of the circuit. The device may be a power transistor having an emitter-base conductor foil and a copper collector plate with a flying-lead connection to the plate. The emitter and base terminal areas may be nylon-riveted to contact areas of a flexible multiconductor strip.

19 Claims, 13 Drawing Figures

SEMICONDUCTOR DEVICE ARRANGEMENTS

This invention relates to arrangements of a semiconductor device mounted on a flexible service strip, particularly but not exclusively for a wiring system for selectively connecting a plurality of electrical loads to a common power source, for example a vehicle wiring system such as that described in U.K. Patent Specification No. 1,287,074 which was published after both of our claimed priority dates. The invention further relates to semiconductor devices, for example transistors, suitable for mounting in such arrangements.

A proposed wiring system for selectively connecting a plurality of electrical loads to a power source comprises a cable in the form of a flexible service strip. The flexible cable includes a layer of insulating material bearing a relatively heavy power conductor and a plurality of relatively light control conductors. The power source is connected to the power conductor. Each electrical load is connected to the power conductor by a semiconductor gate device responsive to a control signal on an associated one of the control conductors. Each semiconductor device is arranged near its associated load. A plurality of control means are selectively operable to apply control signals each to a respective control conductor at locations remote from the associated electrical loads. Such a wiring system can be used for many kinds of apparatus including motor vehicles, aircraft and computer systems.

A problem which arises in such a wiring system is to design a semiconductor device which is readily compatible with a flexible service strip. Thus, for example, the semiconductor device embodiment described in U.K. Patent Specification No. 1,287,074 is a transistor comprising a semiconductor body in a metal can. Such a transistor can be costly to manufacture, can form unreliable terminal connections to the supply conductors of the flexible service strip, and can cause damage to these supply conductors. Furthermore it may be necessary to dissipate a large amount of heat through the emitter terminal, and when the emitter terminal is such a metal can it is difficult to achieve a low enough thermal path from the semiconductor body to the service strip (and possibly to the chassis).

In such a wiring system for a motor vehicle, aircraft or computer, a large number of such semiconductor devices are used. In this context, it is most desirable to reduce the mounting and connection disadvantages and the cost of semiconductor devices for mounting on flexible service strips.

According to a first aspect of the invention there is provided an arrangement of a semiconductor device mounted on a flexible service strip, in which the service strip includes at least two supply conductors, and the semiconductor device comprises a carrier, a semiconductor body secured to and encapsulated on part of the carrier, and a foil secured on the same face of the carrier as the semiconductor body, at least part of which carrier is of metal and provides a terminal connection to an electrode at the major surface of the semiconductor body secured thereto, which foil includes a layer of insulated electrical connection conductors, which connection conductors provide electrical connections between electrodes at the opposite major surface of the semiconductor body and other electrical terminals of the device, at least two of the terminals of the device being present as substantially flat contact areas at the face of the device facing the service strip, at least one of these flat contact area terminals being provided by an exposed part of the connection conductor layer of the foil which overlies a substantially plane part of the carrier surface and faces the service strip, connection areas of the supply conductors being in registration with the said flat contact area terminals of the device facing the service strip, and securing means securing the device against the service strip with the flat contact area terminals of the device in pressure contact with these connection areas of the supply conductors of the service strip.

In such an arrangement of a semiconductor device mounted on a flexible service strip, the semiconductor device is such that it may be manufactured cheaply, and may be adapted for mounting on the flexible service strip in a simple manner with satisfactory terminal connections from the semiconductor body to supply conductors of the service strip.

The said securing means may comprise a clip arrangement whereby the semiconductor device is clipped against the service strip. In such a case, the clip may engage the parts of the carrier of the device behind the said flat contact area terminals so that these terminals are securely held against the connection areas of the supply conductors of the service strip.

However in one preferred form the service strip and the foil and carrier of the device are apertured to provide holes in the connection areas of the service strip in registration with holes in the flat contact area terminals of the device, and the said securing means pass from the said opposite face of the device through the said holes to the face of the service strip opposite the device to secure the device and its flat contact area terminals to the service strip. In this case also these terminals are securely held against the connection areas of the supply conductors, but there is less likelihood of the semiconductor device being dislodged from its desired position on the service strip by, for example mechanical shock. Such securing means may take a variety of forms. They may be secured in a member at the opposite face of the service strip. In one form, the securing means are screw-threaded. In another form, rivets are provided for the said holes, to form particularly simple yet reliable securing means for the device.

such rivets may be hollow or solid, and may be of electrically conductive or insulating material or a combination of both, for example a metal having an anodised surface or an enamel or plastics surface-coating. The rivets may be snap-fit fasteners; such device securing means permit quick and easy fastening of the device. The rivet may be provided with a local weakness and have a "snap-off" head to ensure that in removing a device from the service strip the rivet breaks without the device or service strip being damaged. The rivets may be hollow and form eyelets for the said holes. The outer surface of such eyelets may be lacquered or anodised. The use of eyelets permits reliable, quick and easy fastening of the device to the service strip. The said securing means may be a single rivet member having male portions which pass through the said holes to extend from the said flat contact area terminals of the device; such a rivet can be manufactured cheaply in one-piece; it can be of insulating material and thus form an insulating backing for the carrier terminal connection to the semiconductor body.

The said holes in the flat contact area terminals of the device may be provided towards opposite ends of the device, this permits the device to be arranged on the flexible service strip to give a degree of rigidity to the service strip arrangement. When the foil provides two said flat contact area terminals, one of the holes in the foil may be different in shape and/or size from another or the other of the foil holes, and this can aid identification of the terminals of the device, and hence the device polarity; one of these holes in the foil may be elongate in one direction, and this can assist in the assembly of the foil in the device as well as in any necessary alignment of the foil.

An insulating coating may be present on the supply conductors of the service strip, and the said connection areas may be present at exposed portions of the supply conductors at windows in the insulating coating. In this manner the likelihood of an undesirable short-circuit is reduced, and the device can be satisfactorily secured against service strips having complex supply conductor arrangements.

Corresponding holes in the connection areas of the service strip may be provided with eyelets through which the said securing means pass, each of which service strip eyelets is in electrical connection with a supply conductor, provides the connection area of that susply conductor and is insulated from the other supply conductor or conductors of the service strip. Such service strip eyelets reinforce the holes in the flexible service strip which might otherwise be damaged during mounting or replacement of the semiconductor device. When the device securing means are eyelets a double eyelet arrangement results. Such service strip eyelets may be made partly deformable so that, for example a screw-threaded device securing member can generate its own mating thread in the service strip eyelet.

The rim of each service strip eyelet which faces a flat contact area terminal of the device may be substantially flat; in this way good contact can be achieved between the service strip eyelets and the device terminals, and this can be an important factor for good heat dissipation through the said flat contact area terminals. Sealing rings may be provided around the service strip eyelet rim between the device and the service strip; such sealing rings can protect the electrical connection of the said contact area terminals against dirt, moisture and the like. Such a ring may be of rubber.

All the supply conductors of the service strip may be substantially coplanar. However in a preferred form, the service strip has at least one supply conductor present at each of its opposite major surfaces. The conductors at opposite major surfaces of the service strip may be of different thicknesses or/and material to suit their current handling requirements. Some service strip eyelets may also be used for interconnecting supply conductors on opposite major surfaces of the service strip, and at least one of the service strip eyelets forming a connection area may provide an electrical feed-through from the major surface of the service strip facing the device to a supply conductor at the opposite major surface of the service strip, so that the device is connected in a simple manner to conductors at opposite major surfaces of the service strip.

The service strip may include a main current supply conductor and a control conductor, and the device may include a main current terminal for connection to a load, a flat main current contact area terminal facing the service strip and connected to the main current supply conductor and a flat control contact area terminal also facing the service strip, and connected to the control conductor for controlling the main current flow through the device to the load.

The service strip may include a plurality of control conductors and a single common main current supply conductor which extend in the longitudinal direction of the service strip, each control conductor having provision for electrical connection to the flat control contact area terminal of a semiconductor device which is associated with this control conductor and which has its main current terminals connected between the common main-current supply conductor and a load whereby the current to each load can be controlled by a signal on the control conductor associated with the device connected to that load. In such a case, the arrangement may be used in a computer system, or the service strip may be a wiring harness of a vehicle for example a motor vehicle, at least one of the loads being an electric light of the vehicle, and the power being supplied to the main current supply conductor by the motor vehicle battery. The semiconductor devices can be situated near their associated loads and switched by signals on the control conductor applied by switch means near the driving seat of the vehicle.

The semiconductor device may be a thyristor. However in a preferred form, the semiconductor device is a transistor, the carrier forms a collector connection to the major surface of the body secured thereto, and the foil includes emitter and base connection conductors which are connected to emitter and base electrodes at the opposite major surface of the semiconductor body.

According to a second aspect of the present invention there is provided a semiconductor device for mounting on a flexible service strip in an arrangement in accordance with the first aspect of the invention. The semiconductor device may be sold with or without the device securing means.

One form of such a semiconductor device, for example a transistor, comprises a metal carrier-plate, a semiconductor body secured to and encapsulated on part of the plate, and a laminate foil secured on the same surface of the plate as the semiconductor body, which plate provides a terminal connection to an electrode, for example a collector electrode, at the major surface of the semiconductor body secured thereto, which foil includes a layer of electrical connection conductors on an insulating layer, which connection conductors provide electrical connection to electrodes, for example emitter and base electrodes, at the opposite major surface of the semiconductor body, the foil extending outwardly beyond the semiconductor body, the face of the connection conductors facing the plate being insulated therefrom, the opposite face of the connection conductors also being insulated except where outer exposed portions of the connection conductors form substantially flat contact area terminals of the said device which overlie, and are electrically insulated from, and face away from the plate. Holes may be present in the foil, through the said flat contact area terminals, to provide for securement of the device to the service strip with the flat contact area terminals electrically connected, in pressure contact, to connection areas of supply conductors of the service strip. The plate may be shaped to form another terminal of the device which protrudes at the face of device opposite the foil. Such a device has two flat contact area terminals (for example emitter and base terminals) of the foil at one face of the device.

Another form of such a semiconductor device, for example a transistor, comprises a metal carrier-plate, a semiconductor body secured to and encapsulated on part of the plate, and a laminate foil secured on the same surface of the plate as the semiconductor body, which plate provides a terminal connection to an electrode, for example a collector electrode, at the major surface of the semiconductor body secured thereto, which foil includes a layer of electrical connection conductors on an insulating layer, which connection conductors provide electrical connection to electrodes, for example base and emitter electrodes, at the opposite major surface of the semiconductor body, the foil extending outwardly beyond the semiconductor body over part of one major surface of the plate, part of the one major surface of the plate where not covered by the foil providing a substantially flat contact area terminal (for example a collector terminal) of the device, a terminal connector secured through and insulated from the plate, which terminal connector is electrically connected to one connection conductor of the foil at the one major surface of the plate and protrudes from the opposite major surface to provide another terminal (for example an emitter terminal) of the device, the face of the connection conductors of the foil facing the plate being insulated therefrom, the opposite face of the connection conductors also being insulated except where an outer exposed portion of the other connection conductor or conductors forms another substantially flat contact area terminal (for example a base terminal) of the said device which overlies, is electrically insulated from, and faces away from the plate, and is at the same face of the device as the flat contact area terminal part of the plate. Holes may be present in the foil and plate through the said flat contact area terminals to provide for securement of the device to the service strip with the flat contact area terminals electrically connected, in pressure contact, to connection areas of supply conductors of the service strip. In such a device a terminal connection to the back of the semiconductor body is brought to the front face of the device together with at least one foil connection to the front of the semiconductor body, and another foil connection to the front of the semiconductor body is brought to the back face of the device. Such a construction illustrates some of the versatility in design possible for a semiconductor device in accordance with the second aspect of the invention.

The Applicants are aware that laminate foils having a connection conductor layer on an insulating layer have been used previously for certain semiconductor devices, see for example "Electronics", Volume 44, No. 3, Feb. 1, 1971, pages 44 to 48. However, in general, such prior use of laminate foils is concerned with replacing more conventional conductor lead frames or interconnections for integrated circuits. These known devices are not designed for securing against a flexible service strip in an arrangement in accordance with the present invention, and lack suitable flat contact area terminals on one face of the device, the foil one or ones of which has or have the backing of the carrier which itself provides a terminal connection to the back surface of the semiconductor body.

The foil of these particular forms of the device in accordance with the second aspect of the invention includes an insulating layer as well as a connection conductor layer. In one form, the said insulating layer of the foil is interposed between and provides an electrical insulation between the connection conductor layer of the foil and the said plate; at least one window may be present in the said insulating layer, adjacent the semiconductor body, and the connection conductors may be electrically connected via the window(s) to the electrodes at the said opposite major surface of the semiconductor body. When one window is present, the connection conductors may protrude over part of the window in the insulating layer. The size and shape of the said window may be such that the edge of the window in the foil fits around the edge of the semiconductor body. By providing a close-fitting window around the edge of the semiconductor body, registration can be achieved in a simple manner between the connection conductors of the foil and the said electrodes at the said opposite major face of the semiconductor body, and no location recess for the semiconductor body need be provided in the carrier plate. The connection conductor layer may extend between the said insulating layer and at least one further layer, and the further layer may be of insulating material and may overlie the semiconductor body but not overlie the said flat contact area terminal(s) of the connection conductors. Such a further insulating layer may be an epoxy layer or may be formed by a layer of tape which is wrapped around the foil and carrier arrangement; such a layer of tape could both assist in securing the foil to the carrier and provide an electrically insulating coating over the connection conductor layer and the semiconductor body, and may be an inert pressure-adhesive tape. A layer of lacquer may be present on the body assembly beneath the tape.

In another form, the said insulating layer of the foil overlies the semiconductor body, and the connection conductor layer extends between the said insulating layer and the carrier. At least one further layer of electrically insulating material may be interposed between and provide an electrical insulation between the connection conductor layer of the foil and the carrier, when the carrier is of electrically conductive material. The said flat contact area terminal(s) may be present on the said insulating layer, and peripheral portions of the foil may be folded in a double structure the upper level of which includes the said flat contact area terminal(s) facing away from the carrier. Such flat contact area terminals are somewhat raised above the general level of the surface of the foil facing away from the carrier, it is not necessary to form an opening or openings in the foil to expose the connection conductor layer either at the said contact surfaces or adjacent the semiconductor element, and a pliable washer or plug may be provided within the foil, beneath the flat contact area terminal. Such a pliable washer or plug can deform to accommodate unevenness in the contact between the said flat contact area terminal of the device and the service strip, and avoids excess strain being produced in the device assembly when mounting.

The connection conductors may extend outward from the semiconductor body towards opposite ends of the foil, and the connection conductor layer of the foil may include isotated portions which are not electrically connected to the said electrodes of the semiconductor element and which serves to reinforce the foil between its oppositely-extending conductors. The connection conductor layer may be of material deposited on the insulating layer, or it may be a patterned conductor foil bonded to the insulating layer. Its pattern may be defined photolithographically. At least part of the connection conductor layer may be thickened by for example gold-plating, or in the case of electrode contact areas by solder-coating.

The connection conductor layer may be so thick and of such material that efficient dissipation of heat developed by the device is possible through the said flat contact area terminal(s).

The connection conductors may be secured to the semiconductor body electrodes by soldering, by pressure-bonding at a temperature below the melting point of the metal(s) to be joined, or by any other suitable method. The semiconductor body may be secured to the carrier in a similar manner. In one preferred form, the connection conductor layer is secured to the electrodes in the same operation as the semiconductor element is secured to the carrier; this may be effected by a pressure-bonding or re-flow soldering technique. The semiconductor body may be situated in a recess on the carrier. When the semiconductor body is soft soldered to the carrier, a capillary-flow soldering technique may be employed in which solder preforms are arranged in side recesses communicating with the main semiconductor element recess, and, on heating, the solder melts and flows by capillary action between the semiconductor body and the floor of the main semiconductor body recess; in such a case the floor of the side recesses may be sloped to assist the flow of solder towards the semiconductor body. Solder regions may be provided on the semiconductor body, the foil, or/and the carrier to make the required connections.

A semiconductor body recess may fit around the semiconductor body to define its location on the carrier; in this case, the holes in the foil can be utilised to define the location of the foil relative to the carrier and hence the location of the connection conductor layer relative to the semiconductor body electrodes. However, when a location window for the semiconductor body is present in the foil as described hereinbefore, any semiconductor body recess in the carrier is preferably not close-fitting with respect to the semiconductor element periphery. An epoxy surround may be present around the semiconductor element to provide a seal between the carrier and foil, at least around the semiconductor body. Such an epoxy surround may be provided by printing on the carrier or as a preform.

Both the carrier and the connection conductors of the foil may be designed for good thermal dissipation. Thus, the carrier may be provided with a finned structure to assist in dissipating heat through the said one major face of the semiconductor element. Such a finned structure may be an integral part of the carrier or may be clipped onto the carrier.

Instead of a metal carrier plate the carrier for the semiconductor body and foil may have a different form. Thus the carrier may comprise a metal stud on which the semiconductor body is mounted, and this stud may be held in an electrically insulating base.

The foil need not be a laminate of a connection conductor layer on an insulating layer but may consist of a metal foil forming the connection conductors and having insulation material on parts of the device, for example on parts of the metal foil and on a part of the carrier. Such insulation material may be an insulating coating or tape.

Embodiments of the present invention will now be described, by way of example, with reference to the accompanying diagrammatic drawings, in which.

Figure 1:
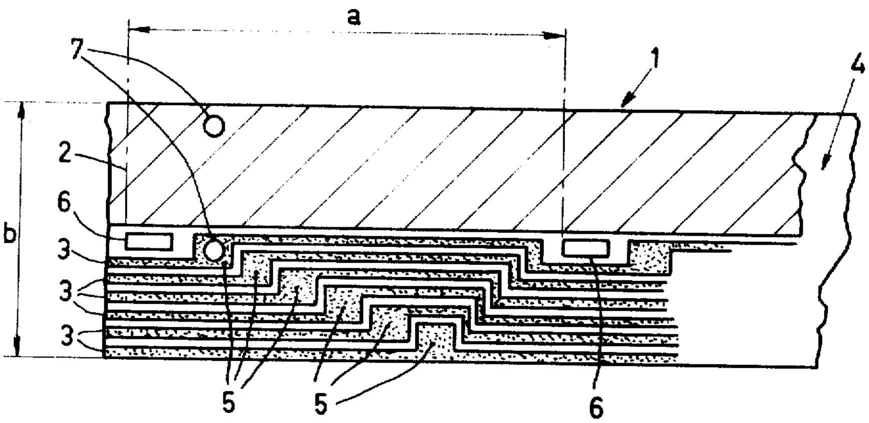
FIG. 1 is a plan view of a flexible service strip on which a transistor can be mounted.
Figures 2, 3:
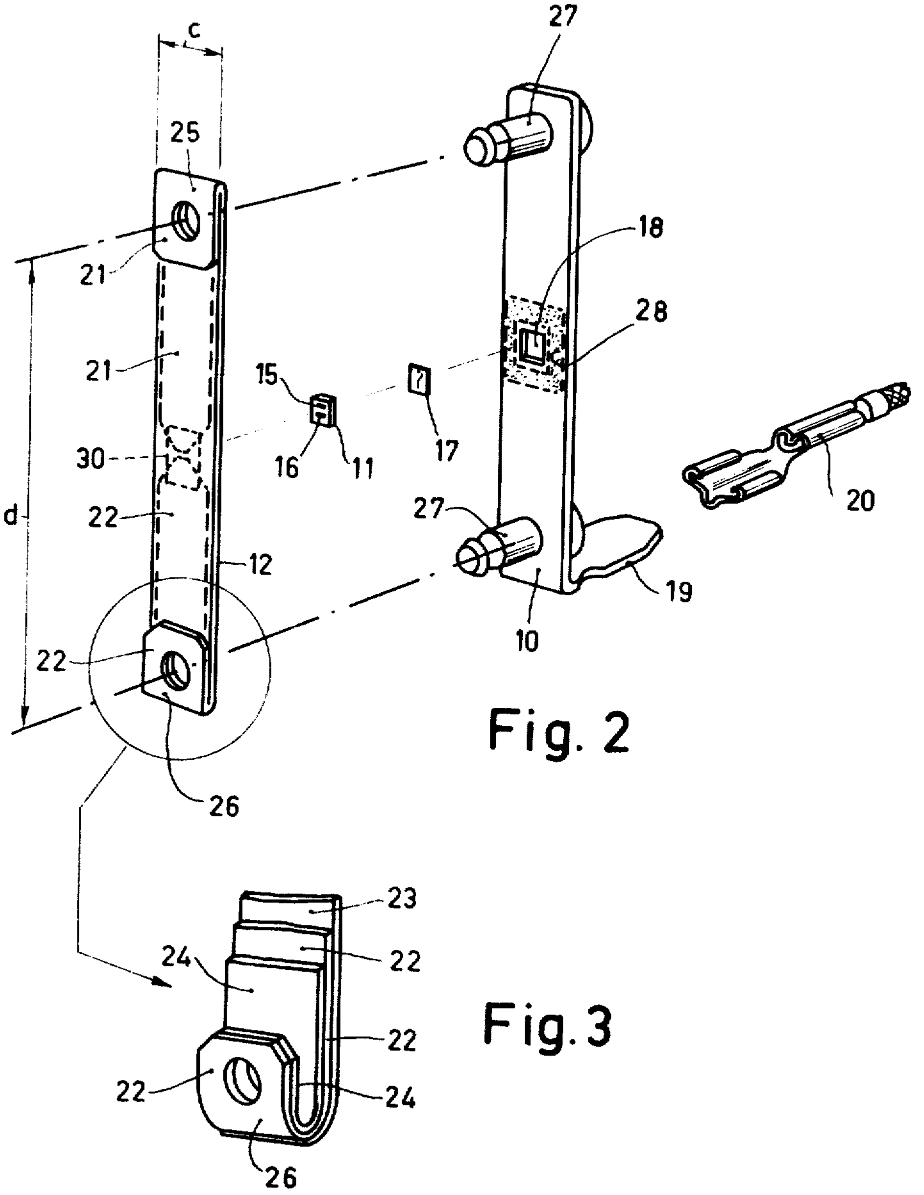
FIG. 2 is an exploded perspective view of a first transistor.
FIG. 3 is a perspective view of the circled foil termination detail of FIG. 2.
Figure 4:
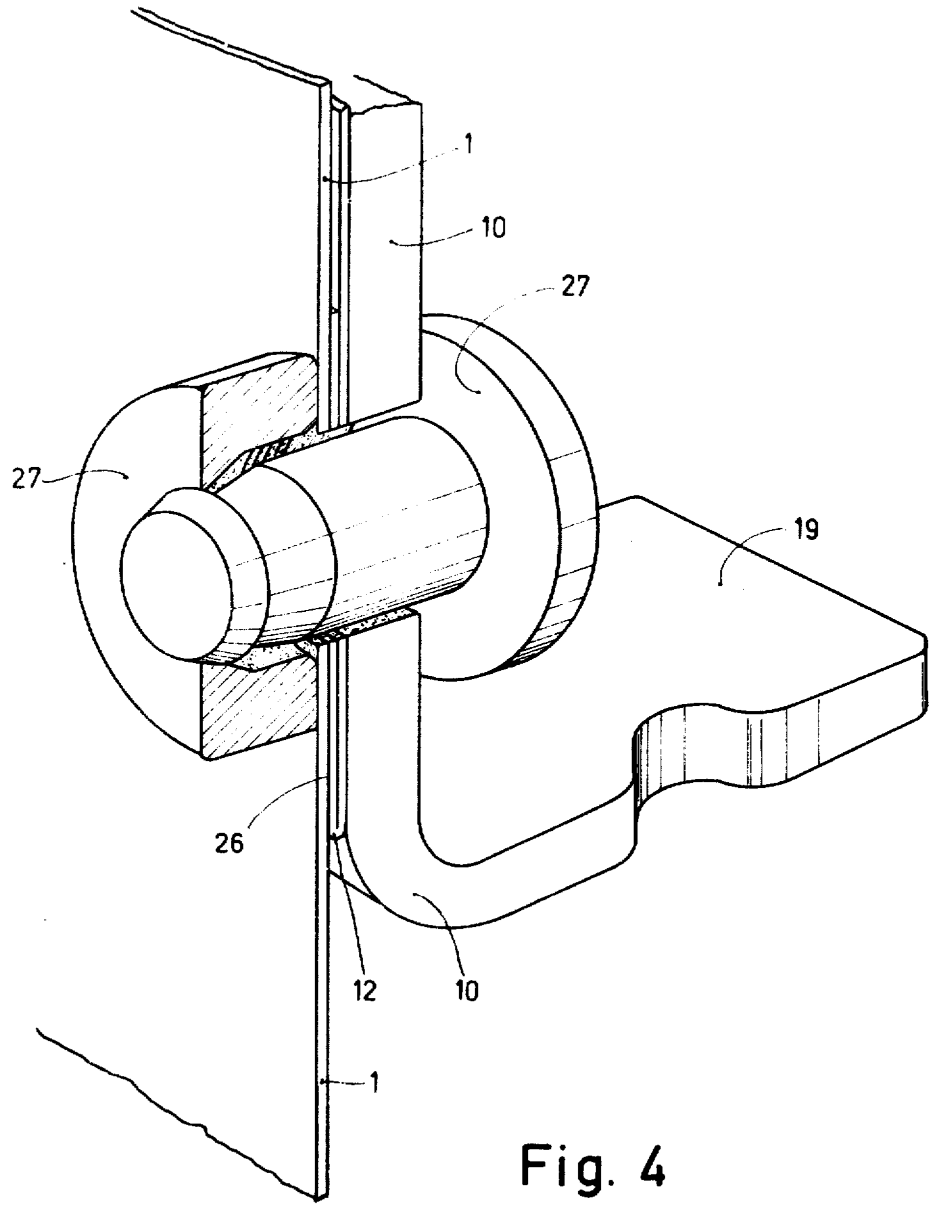
FIG. 4 is a partly cut-away perspective view of part of this transistor mounted on the service strip showing a terminal contact.

The service strip 1 shown in FIG. 1 is one form of flexible service strip suitable for use in an arrangement in accordance with the present invention. The strip 1 is a laminate comprising electrical supply conductors 2 and 3 on an insulating substrate layer 4. Switching transistors such as the transistor shown in FIGS. 2 and 3 are suitable for mounting on this service strip 1 with the emitter of the transistor connected to the broad common, power conductor 2, and the base of the transistor connected to one of the series of narrower, switch control conductors 3. A load connection may be made to the transistor collector by a flying lead. The arrangement is designed for use in superseding the present day motor car wiring harness, the transistor load being for example lights or electronic aids of the car, and the power being supplied from a car battery.

The strip 1 may have these power and control conductors 2 and 3 on both sides of a central insulating foil 4 to form a double-sided conductor strip 1.

Each control conductor 3 has an enlarged contact area which can be contacted by the transistor base terminal. In the strip shown there are six such control conductors 3 and contact areas 5. The pattern formed by the control contact areas 5 and conductors 3 and shown in FIG. 1 is repeated at regular intervals along the length of the strip. By using a close repeat pattern a standard flexible electrical service strip can be used for a range of car models. Some of the conductors 3 may have large enough contact areas 5 for mounting several transistors together in parallel, for example for high power applications.

The strip may be protected by an insulating coating, all possible transistor mounting contact areas being available through windows in the outer insulation, and occurring in groups of six throughout the length of the service strip 1; the conductors in these areas may be protected by a plated surface. An indexing slot 6 is cut through the insulating layer on each pattern repeat; this slot 6 can be used for auto-indexing of the strip through a press tool for punching transistor mounting holes in the conductors 2 and 3. The tool could be programmed for the requirement of the specific vehicle. The slots 6 may also be of a form suitable for locating the strip 1 when insulating in the motor car.

Two transistor mounting holes 7 are shown in FIG. 1. As described hereinafter these permit a transistor to be connected in a simple manner across the strip 1 between the power conductor 1 and the nearest switch control conductor 3. Holes are provided elsewhere in other control conductors 3 and the power conductor 2 where it is desired to mount other transistors.

The dimensions $a$ and $b$ of the strip may in a typical case be 7 cms. and 4 cms. respectively. In such a case the conductor contact pattern is repeated every 7 cms. along the length of the strip.

Various aspects of the switching transistor suitable for direct mounting on this strip 1 are shown in FIGS. 2 to 5.

The transistor comprises a metal carrier strip 10 which acts as the collector terminal and supports a transistor element 11 and a laminate flexible conductor foil 12.

Figure 5:
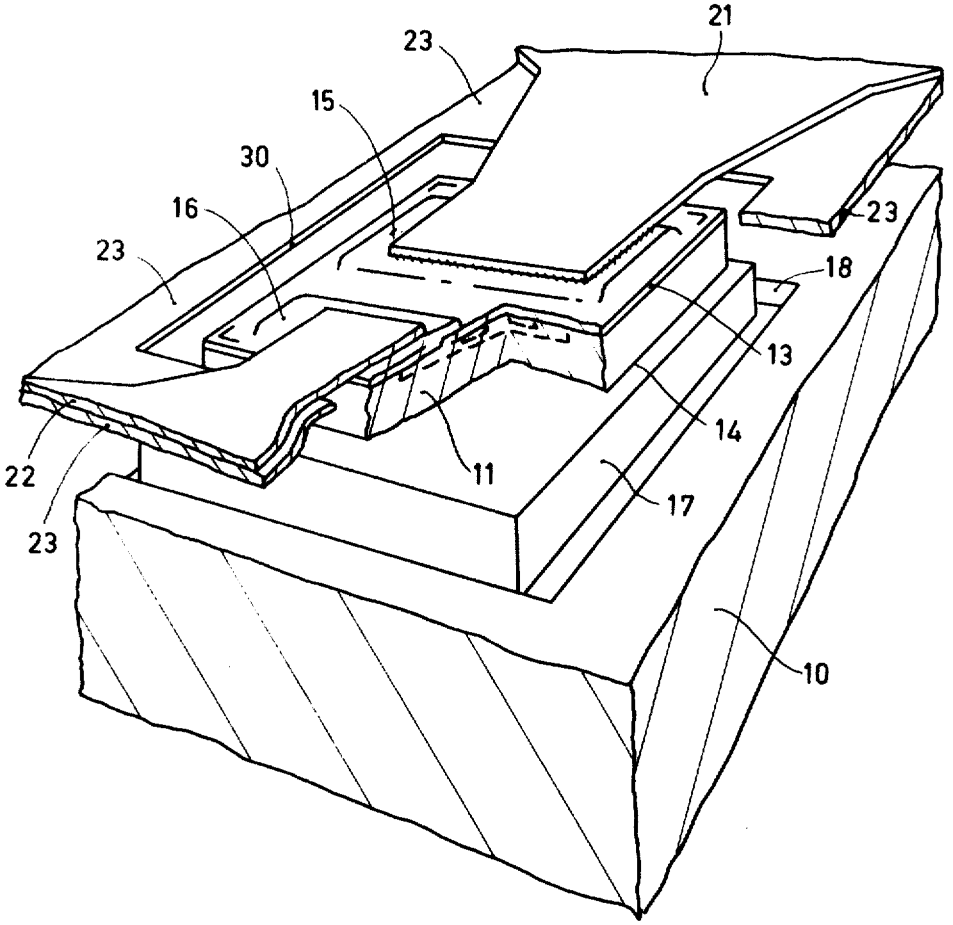
FIG. 5 is a partly cut-away perspective view of such a transistor showing the transistor electrode connection.

The transistor element 11 comprises a silicon body having opposite major faces 13 and 14, see FIG. 5. Emitter and base regions are present in the silicon body adjacent the surface 13; the part of the body adjacent the surface 14 forms the collector region of the transistor. The transistor is a p-n-p switching transistor and has an integrated emitter-base resistor which is not shown in the drawings. The surface 13 has a glass insulating layer thereon with large area emitter and base electrodes 15 and 16 connected via windows in the insulating layer to the emitter and base regions in the body. In FIG. 5 part of the silicon body, glass layer 14 and base contact is cut-away.

A relatively high heat dissipation is required for this particular transistor, in the order of, for example 3.5 watts. Furthermore, the transistor is to be mounted unconventionally i.e. with its collector not directly secured to the substrate on which the transistor is to be mounted; thus, there is a poor thermal path through the collector mounting. To enable a large proportion of this dissipation to be removed via the emitter, the emitter electrode 15 is constructed so as to have a large area termination which may be of a tin-lead alloy or gold-tin alloy, or for example a silver-titanium or aluminum metallization for pressure bonding.

The transistor element 11 is mounted on an electrically conductive preform 17. The surface 14 of the silicon body being bonded to the preform 17 to form the collector connection. The transistor element 11 and preform 17 are secured to the carrier strip 10, their precise location on the strip 10 being determined by a coined square recess 18 in the surface of the strip 10. In this device the recess 18 fits tightly around the transistor element periphery. The strip 10 may be of copper, and be designated to aid heat dissipation also from the surface 14 of the transistor element. The strip 10 has one end formed approximately normal to the main part of the strip and shaped to produce a spade-type connector terminal 19 which will accept a load conductor wire 20 to make connection to the collector.

The emitter and base connections between the transistor element and the main service strip 1 are copper foil conductors 21 and 22 sandwiched between two insulating films 23 and 24 to form the laminated foil 12. The films 23 and 24 may be of polyimide material known by the Trade Name "Kapton", and may be coated with a fluorocarbon resin which is heat-bondable and known by the Trade Mark "Teflon F.E.P.". This laminate is approximately the size of the carrier strip 10 with the two conductors 21 and 22 made as large as possible for good thermal dissipation and electrical conduction. The conductors 21 and 22 are free of the insulating film 23 at a window 30 therein adjacent the transistor element 11 to expose contact areas of the conductors 21 and 22 for connection to the emitter and base electrode 15 and 16 respectively. This window need not fit tightly around the transistor element periphery.

The conductors 21 and 22 are also free of the insulating film 23 at opposite ends of the foil strip 12. These opposite ends are folded over to provide peripheral bared flat areas 25 and 26 of the conductors 21 and 22 on the surface of the foil 12 remote from the plate 10. These flat areas 25 and 26 constitute the emitter and base terminals respectively of the transistor. Mounting holes are punched through these flat terminal areas 25 and 26 of the foil 12. Corresponding holes were punched through the carrier strip 10, and carry the male portion of an insulating rivet 27. This male portion of the rivet 27 fits through both the mounting holes in the strip 10 and foil 12 of the transistor envelope and the mounting holes 7 provided in the service strip 1.

The carrier strip 10 with the transistor element 11 mounted thereon is printed with an insulating epoxy 28 and around the recess 18. The emitter-base conductor laminate 12 is then positioned over the rivets 27 of the strip 10, and this aligns the conductor fingers 21 and 22 aligned with the emitter and base electrodes 15 and 16 of the transistor element 11. When the epoxy 28 has cured, soldered connections are made through the foil 12 between the conductors 21 and 22 and the electrodes 15 and 16.

When clipping the transistor switch assembly to the main service strip 1, contacts are made by squeezing the bared flat area terminals 25 and 26 of the emitter and base conductors 21 and 22 against the conductors 2 and 3 of the service strip 1 with the male portion of the rivets 27 inserted through the mounting holes 7 in the strip 1. The female portion of the rivet is located at the opposite surface of the strip 1, see FIG. 4, and forms a snap-fit fastening with the male portion.

The dimensions $c$ and $d$ of the foil 12 may in a typical case be 6 mm. and 2 cms. respectively. The rivet 27 may be of nylon.

Figure 6:
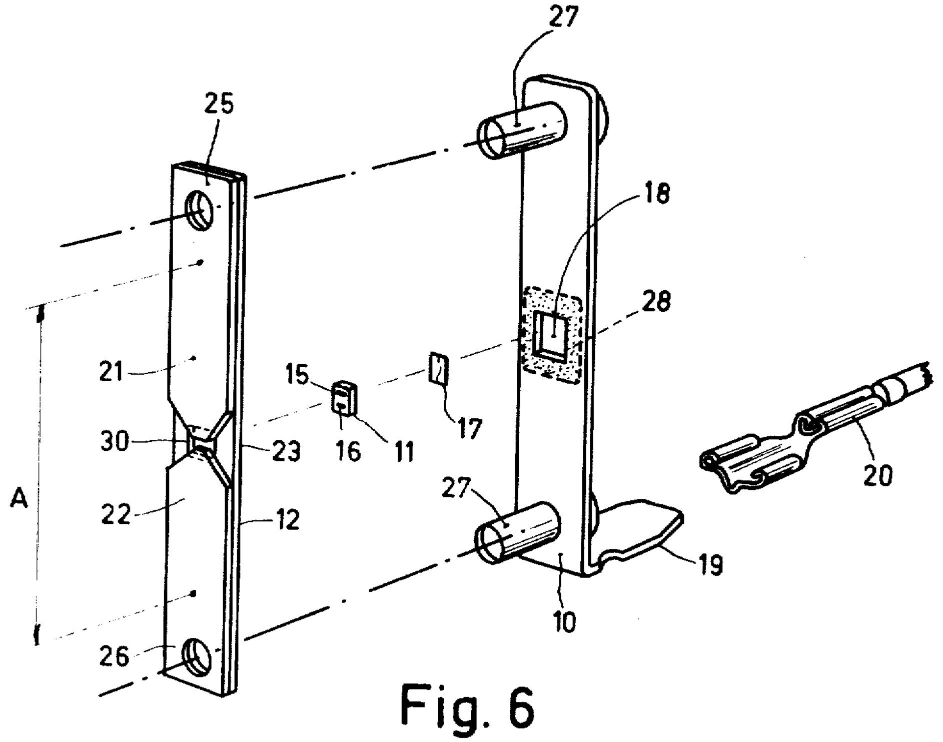
FIG. 6 is an exploded perspective view of a second transistor.
Figure 7:
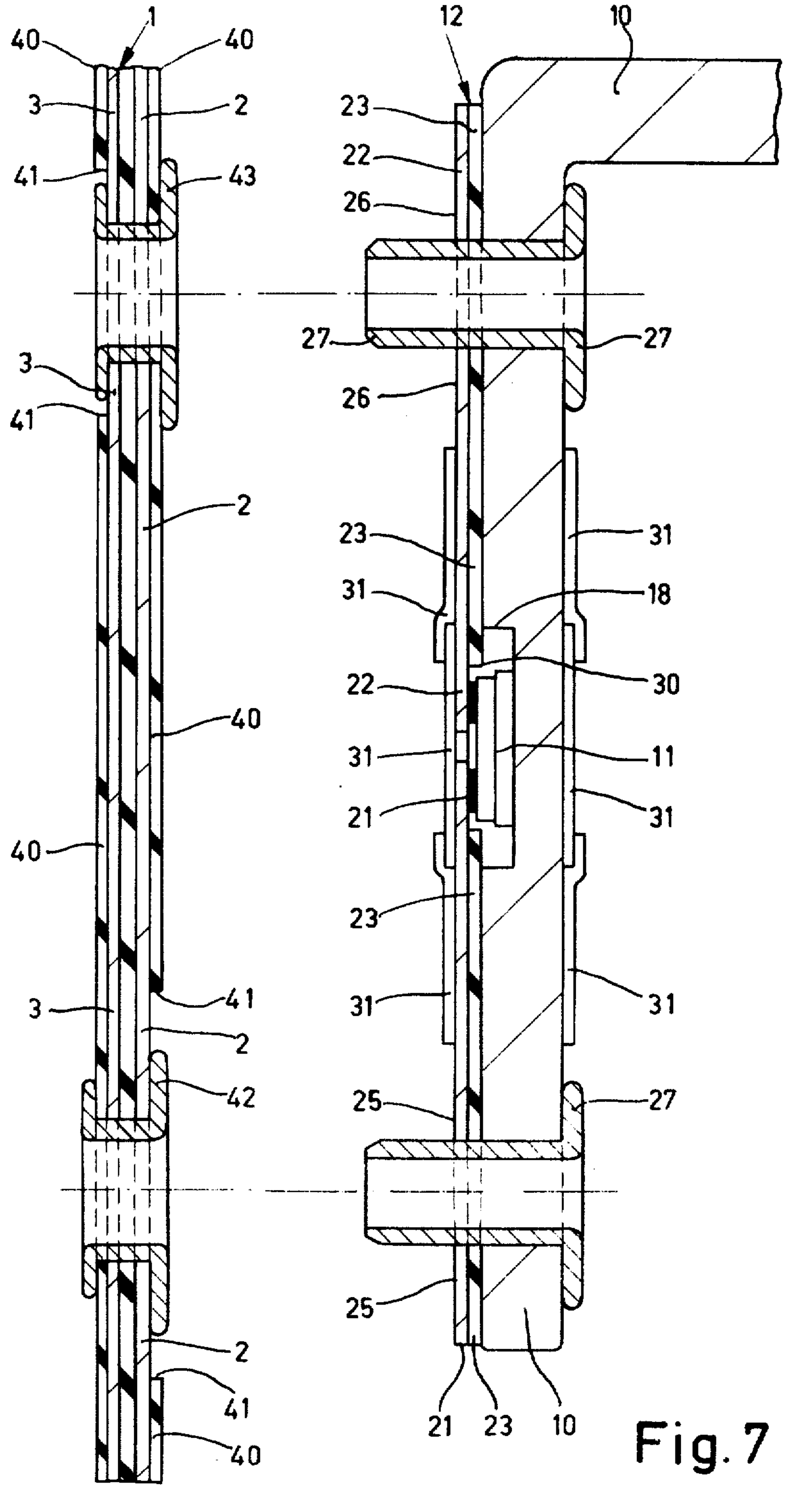
FIG. 7 is a cross-sectional view of the transistor of FIG. 6 and part of a flexible service strip on which the transistor is to be mounted.

The transistor shown in FIGS. 6 and 7 is similar to that shown in FIG. 2, and has a similar transistor element 11.

The transistor element 11 is mounted on an electrically conductive preform 17, the surface 14 of the silicon body being bonded to the preform 17 to form the collector connection. This preform 17 may be of a molybdenum and may in certain cases be omitted. The transistor element 11 and preform 17 (if present) are secured to the carrier strip 10 at a coined recess 18 in the surface of the strip 10.

The emitter and base connections to the transistor element are copper foil conductors 21 and 22 bonded to an insulating film 23 to form the laminate foil 12. The conductors 21 and 22 are free of the insulating film 23 at window 30 adjacent the transistor element 11 to expose contact areas of the conductors 21 and 22 for connection to the emitter and base electrodes 15 and 16 respectively as shown in FIG. 2. The insulating layer 23 is present between the collector strip 10 and the foil conductors 21 and 22 to provide electrical insulation therebetween. An insulating epoxy surround 28 extends laterally around the recess 18, see FIG. 1, and assists in providing a seal laterally around the transistor element 11, between the strip 10 and the foil 12. When the insulating layer 23 has a bondable coating adjacent the strip 10, it is possible for the foil 12 to be bonded to the strip 10 by this coating.

Envelopment of the transistor element 11 is completed by an insulating cover over the window 30 in the foil. Such an insulating cover may be a blob of synthetic resin provided on the foil 12 at the window 30 after the emitter and base conductors 21 and 22 have been connected to the emitter and base electrodes 15 and 16 respectively of the element 11. However in the form shown in FIG. 7, the insulating cover consists of an inert insulating tape 31 which is wrapped around the foil and carrier strip assembly 12 and 10 over the distance designated A in FIG. 6. One advantage of using such a tape 21 is that it assists in binding and holding the foil and carrier strip assembly together, at least around the middle of the length of the strip. The tape 31 may be pressure-adhesive. One make of tape that could be used is the tape available under the Trade Mark "Tesa-Film 108". A layer of lacquer may be present on the transistor element and conductor assembly 11, 21 and 22, beneath the tape 31. In choosing a suitable tape 31 regard must be had to the temperature that will prevail in operation of the device.

The tape 31 or other insulating cover is present on the conductors 21 and 22 over the distance A shown in FIG. 6. The conductors 21 and 22 are free of this insulating cover layer 31 at opposite ends of the foil strip 12. Thus, in the complete device, peripheral bared flat areas 25 and 26 of the conductors 21 and 22 are present. These areas 25 and 26 form contact surfaces for the electrodes 15 and 16 and constitute the emitter and base terminals respectively of the transistor.

Mounting holes are punched, etched or otherwise provided through these contact surfaces 25 and 26 of the foil, see FIG. 6. Corresponding holes are present in the carrier strip 10. These holes provide for securement of the device to a substate with the said contact surfaces 25 and 26 connected to contact areas of conductors of the substrate. Securing means in the form of eyelets 27 extend through these holes in the strip 10 and foil 12, from the back-side of the strip 10, see FIG. 7.

The transistor may be manufactured in the following manner. The transistor element 11 is secured on the preform 17, if present, in a conventional manner. The semiconductor element 11 is placed in the recess 18 of the collector strip 10, and the epoxy surround 28 is provided around the recess 18, for example either as a preform or by printing.

In the device shown in FIGS. 1 and 3, the alignment of the emitter and base conductors 21 and 22 of the foil 12 with the emitter and base electrodes 15 and 16 of the semiconductor element 11 is effected using the window 30 of the foil 12. In this case, the recess 18 in the collector strip 10 is significantly larger than the semiconductor element (and any preform) periphery and does not determine the precise location of the semiconductor element 11 on the strip 10, and the semiconductor element 11 is secured to the collector strip 10 only after providing the foil 12. The size and shape of the window 30 in the foil 12 is such that this window 30 fits closely around the upper edge of the semiconductor element 11 and therefore confines the semiconductor element 11 into registration with the electrode connection conductors 21 and 22. In this manner, the conductors 21 and 22 and electrodes 15 and 16 are aligned when the emitter-base conductor laminate 12 is positioned over the eyelets 27 of the collector strip 10. Then, when the epoxy 28 has cured, connections are made between the collector strip 10 and the semiconductor element and preform assembly 11 and 17, and between the foil conductors 21 and 22 and the element electrodes 15 and 16. Such connections may be made simultaneously by for example pressure-bonding or by reflow-soldering. Finally, the insulating coating 31 is provided.

Such transistors may be mounted on a flexible service strip with the emitter and base contact surfaces 25 and 26 connected to conductors at the same surface of the service strip or at opposite surfaces of the service strip.

FIG. 7 shows part of a suitable substrate in the form of a flexible laminated service strip 1 having conductors 2 and 3 at opposite major surfaces of a central insulating foil.

The strip 1 is protected by an insulating coating 40 and all possible transistor connection areas are available through windows 41 which are present in the outer insulation and are repeated throughout the length of the service strip 1; the conductors 2 and 3 in these windows 41 may be protected by a plated surface.

Transistor mounting holes are present along the length of the strip in exposed parts of the conductors 2 and 3 at the windows 41 to permit the transistor to be connected between the power conductor 2 and a control conductor 3. A pair of such holes are present in the part of the flexible substrate 1 shown in FIG. 7, and, as shown in FIG. 3, an electrically conductive eyelet 42 or 43 is present in each substrate hole in electrical contact with the conductor 2 or 3. These eyelets 42 and 43 reinforce the flexible substrate 1 around the hole and provide conductive feed-throughs of their respective conductors from one major surface of the strip 1 to the opposite major surface. Thus, as shown in FIG. 7, the control conductor 3 is exposed at window 41 at the surface of the strip 1 remote from the transistor, and the eyelet 43 contacts this exposed area of conductor 3 and provides a conductive feed-through to the surface of the strip 1 facing the transistor. The end surface of the substrate eyelets 42 and 43 facing the transistor is made as flat as possible to maximise contact, and hence thermal conduction, between the transistor contact surfaces 25 and 26 and the conductive substrate eyelets 42 and 43.

The transistor is mounted on the flexible substrate 1 by passing the transistor eyelets 27 into the substrate eyelets 42 and 43; pressure is applied to deform the protruding ends of the transistor eyelets 27 against the back of the substrate 1 and to squeeze the exposed emitter and base contact surfaces 25 and 26 of the transistor against the eyelets 42 and 43 of the substrate 1.

Figure 8:
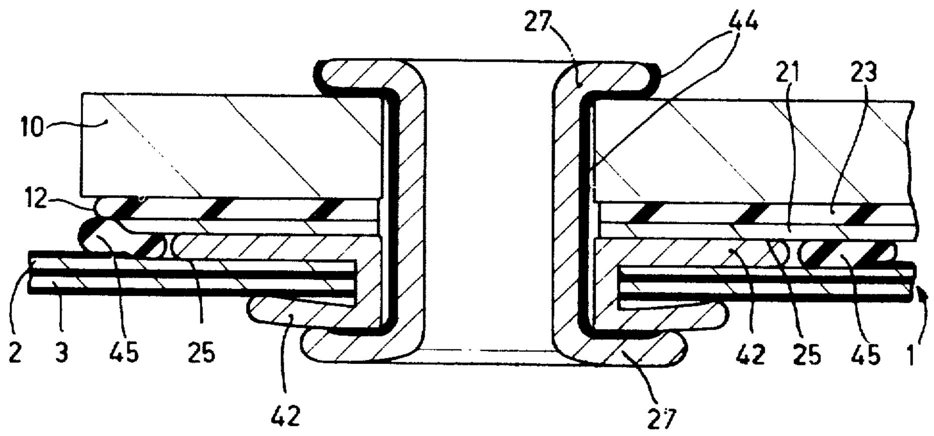
FIG. 8 is a cross-sectional view of part of such a transistor of FIG. 1 when secured to the flexible service strip.

FIG. 8 shows in enlarged view the emitter terminal connection so formed. It should be noted that the eyelet 27 has an insulating outer surface 44 to prevent the collector strip 10 being shorted to the terminal area 25 and conductor 3 by the eyelet 27. This insulating outer surface may be a coating of lacquer or plastics material or, for example, an anodized surface layer of the eyelet 27. Furthermore, an insulating rubber sealing ring 45 is present around the substrate eyelet 42 adjacent the foil 12. The ring 45 protects the pressure contact between the substrate eyelet 42 and the transistor contact surface 25 against dirt and moisture.

Figure 9:
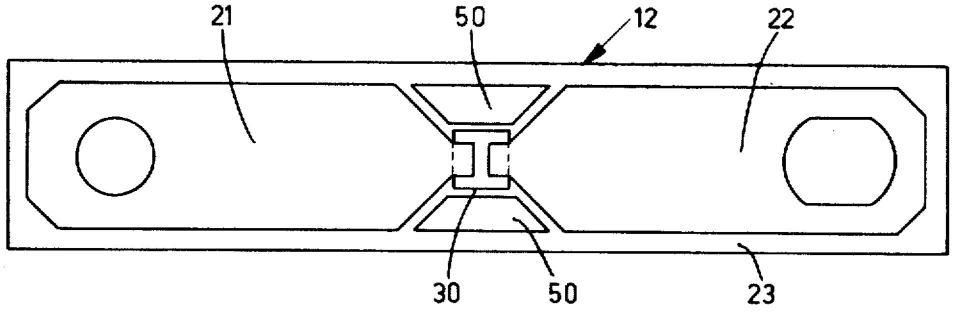
FIG. 9 is a plan view of a foil of a similar transistor.

It will be obvious that many modifications and variations are possible within the scope of the invention. The foil 12 of the transistor may be made by bonding together copper and polymide foils, then etching the window 30 in the polyimide, gold-or otherwise plating the copper where exposed at the window 30 and then defining the copper conductor pattern on the opposite surface of the polyimide. However the copper conductor pattern may be both formed and built up on a polyimide foil by an additive process, such as plating. The foil 12 shown in FIG. 9 is suitable for use in the transistor of FIGS. 6 to 8. In consists of a copper pattern 21, 22, and 50 on a polyimide foil 23. The copper pattern comprises a connection conductor pattern 21 and 22 similar to that shown in FIGS. 6 to 8 and reinforcing copper lands 50 which are designed for reinforcement of the foil 12 between the coductors 21 and 22. Furthermore in the ends of conductors 21 and 22 there are present differently sized and shaped mounting holes.

Figure 10:
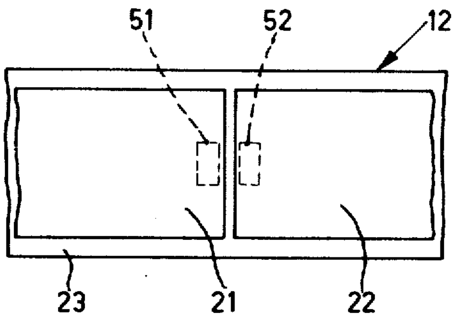
FIG. 10 is a plan view of a central part of another foil of a transistor.

The central portion of foil 12 shown in FIG. 10 includes an insulating layer 23 having thereon connection conductors 21 and 22. The conductors 21 and 22 are exposed at the underside of the layer 23 at two narrow windows 51 and 52 therein, and it is via these exposed parts at windows 51 and 52 that the conductors 21 and 22 are connected to electrodes 15 and 16 of the semiconductor element 11. For this purpose, the windows 51 and 52 may be solder-filled and a reflow solder technique may be employed to make these electrode connections. An advantage of using such separate windows 51 and 52 is that the conductor pattern 21 and 22 adjacent the semiconductor element can be simplified since the definition, location and arrangement of the conductor contact areas for connection to the emitter and base electrodes 15 and 16 is determined by the windows 51 and 52 in the insulating layer 23. The terminal contact surfaces of the foil 12 of FIG. 10 may be of the form shown in the foil of FIGS. 6 and 7 or FIG. 9, or they may be of the folded form shown in FIGS. 2 and 3.

The repeat pattern of the substrate conductors 2 and 3 may be varied to accommodate different device sizes which are determined, for example, by the power handling capability of the device.

In the context of increasing the power handling capability of the device, the carrier 10 of the device may be expanded from the simple strip form shown; thus, for example, the carrier 10 may be a generally diamond-shaped plate having an upstanding terminal portion 19 and may have an integral or clipped-on finned structure.

Figure 11:
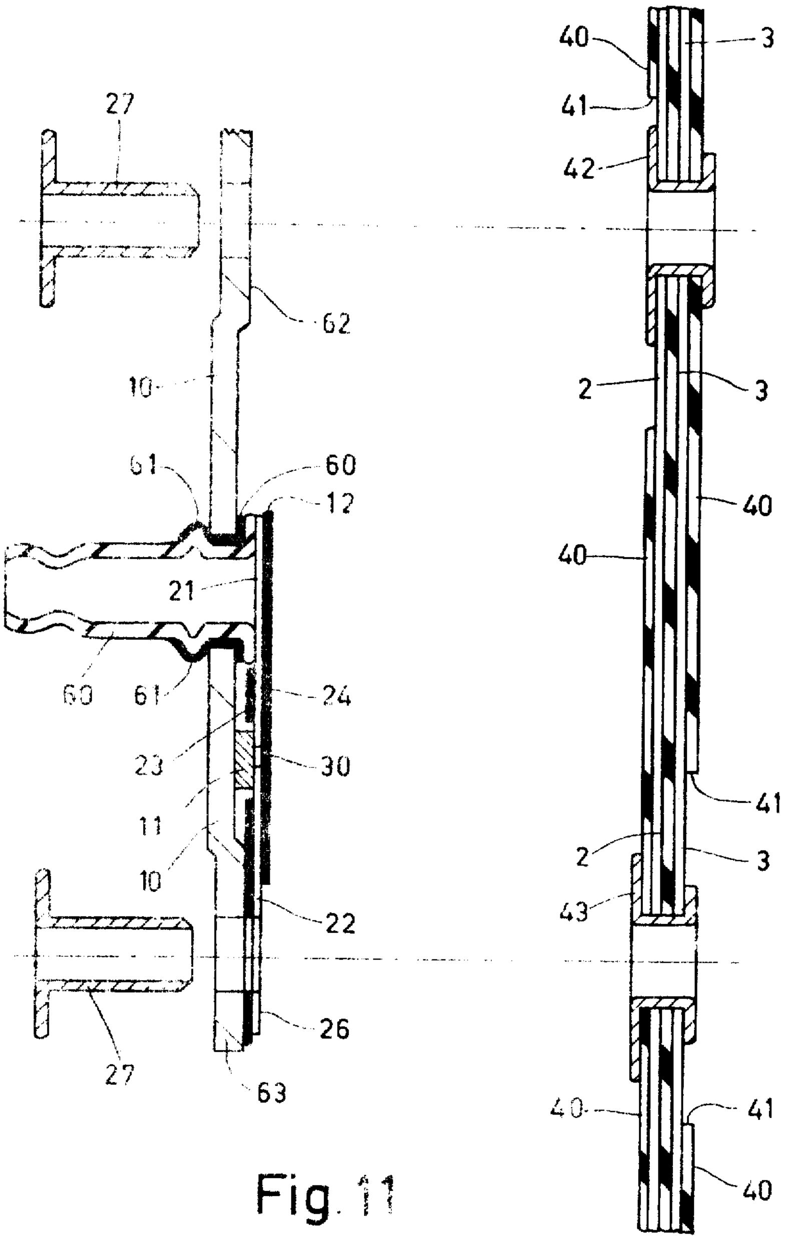
FIG. 11 is a cross-sectional view of a third transistor and part of a flexible service strip on which the transistor is to be mounted.
Figures 12, 13:
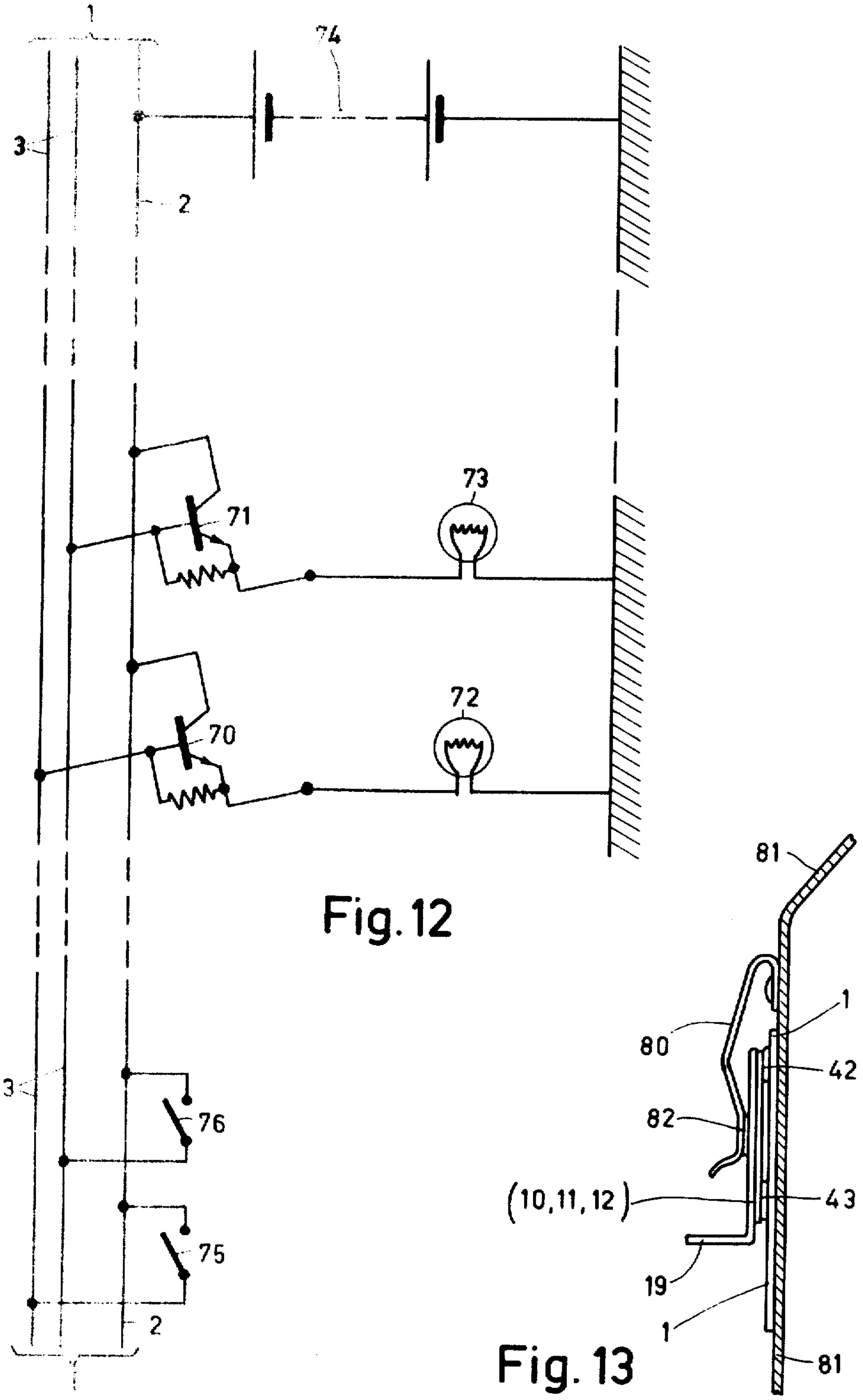
FIG. 12 is a circuit arrangement including two such transistors and certain conductors of the flexible service strip.

In the arrangement shown in FIGS. 11 and 12, the transistor is an n-p-n switching transistor having an integrated emitter-base resistor which is present in the semiconductor body between the emitter and base electrodes of the body. Parts of the present arrangement which correspond to parts of the earlier arrangements are designated by the same reference numerals. The present transistor comprises a metal carrier 10. The carrier 10 provides the collector terminal 62 and supports a transistor element 11, an emitter terminal 60, and a laminate flexible conductor foil 12 providing a base terminal 26. The load connection is made to the emitter terminal 60 of the transistor.

The metal carrier 10 is depressed over a central portion of its length. The non-depressed end parts 62 and 63 are apertured to accommodate eyelets 27. The collector surface of the transistor element 11 is secured to part of the depressed portion of the carrier 10 which thus forms the collector connection to the transistor body. A conventional connector terminal 60 is fixed in part of the depressed portion of the carrier 10. The terminal 60 is insulated from the collector carrier 10 by insulator 61 which may be a coating on the terminal surface, or an insulating plug. The terminal 60 serves as the emitter terminal of the transistor and will accept a load wire to make the load connection. The foil 12 covers a length of the carrier 10 from the end part 63 to the emitter terminal 60. Thus, the non-depressed end part 62 is exposed and provides the collector terminal of the transistor. The insulating layer 23 of the foil leaves exposed a part of emitter conductor 21 of the foil which is aligned with and bonded in electrical contact to the head of the emitter terminal 60. The insulating layer 24 of the foil leaves exposed only the outer end part 26 of base conductor 21. This end part 26 is apertured to receive eyelet 27 in end part 63 of the strip 10 and acts as the base terminal.

Thus in the device of FIG. 11, the base and collector terminals 26 and 62 respectively are planar contact surfaces at a common major surface of the transistor.

The transistor of FIG. 11 can be secured to a flexible service strip having conductors located at the same surface of the service strip or at opposite surfaces thereof. In the arrangement shown in FIG. 11, the strip 1 is similar to that shown in FIG. 7. Similar switching transistors can be connected between the power conductor 2 and any one of the control conductors 3. A load connection may be made to the transistor emitter by a flying lead. The arrangement is shown in FIG. 12, where only two transistors 70 and 71 are shown for clarity and by way of example. The transistor loads may be, for example lights 72 and 73 or electronic aids of a vehicle. The power may be supplied from a vehicle battery 74. The transistors 70 and 71 are individually switched by base signals applied via conductors 3 and manual switches 75 and 76 connected between conductors 2 and 3. The switches 75 and 76 may be located on the dashboard of the vehicle.

In the transistor arrangements of FIGS. 7 and 11, the device securing means are shown to be eyelets 27. However many other forms of device securing means are possible. In the arrangement shown in FIG. 4, the transistor device (10, 11, 12) is clipped onto the service strip by a snap-fit fastener 27; as described hereinbefore, this clip fastener 27 passes through holes in the service strip 1 and the device carrier and foil 10 and 12. However, other clip fasteners may be used which do not pass through holes in the transistor device and service strip arrangement, and an example of such is shown in the arrangement of FIG. 13.

FIG. 13 shows in cross-sectional view, a transistor (10, 11, 12) which is similar to the transistor shown in FIGS. 2 and 6 and which is clipped against a flexible service strip 1 by a spring clip 80. The clip 80 is rigidly secured at one end to a structural member 81 of a chassis. The clip 80 therefore also urges the transistor device and service strip arrangement against the member 81, and this can aid heat dissipation. Many modifications in the form of the clip 80 are possible; thus, the free end of the clip 80 may be releasably engageable with part of the member 81. The clip 80 may bear against the metal carrier 10 of the transistor and so be in electrical contact therewith; in this case terminal protrusion 19 of the transistor device may be omitted and a load connection made direct to the clip 80, when the clip 80 is electrically conductive. The service strip 1 may be present between the transistor device (10, 11, 12) and the clip 80, so that the clip 80 bears against the service strip 1 at the flat contact area terminals 25 and 26 of the device (10, 11, 12).

When the electrical load is connected between the chassis and the load terminal of the transistor device, it is necessary to electrically insulate this load terminal from the chassis. As shown in FIG. 13 this may be achieved by providing insulating material 82 between the clip 80 and the device carrier connection 10. In another form, the member 81 may be secured in an insulated manner to the chassis.

The member 81, clip 80, service strip 1 and device (10, 11, 12) may each have cooperating location means for facilitating the proper location of components of the arrangement in relation to each other. The service strip 1 may have eyeletted supply conductor connection areas 42 and 43 and the device flat contact area terminals 25 and 26 may be provided with local protrusions which fit into the eyelet holes of the service strip 1 to locate the flat area terminals 25 and 26 in registration with these connection areas 42 and 43.

What we claim is:

1. An arrangement of a semiconductor device mounted on a flexible service strip, in which the service strip includes at least two supply conductors, and the semiconductor device comprises a carrier, a semiconductor body secured to and encapsulated on part of the carrier, and a foil secured on the same face of the carrier as the semiconductor body, at least part of which carrier is of metal and provides a terminal connection to an electrode at the major surface of the semiconductor body secured thereto, which foil includes a layer of insulated electrical connection conductors, which connection conductors provide electrical connections between electrodes at the opposite major surface of the semiconductor body and other electrical terminals of the device, at least two of the terminals of the device being present as substantially flat contact areas at a face of the device facing the service strip, at least one of these flat contact area terminals being provided by an exposed part of the connection conductor layer of the foil which overlies a substantially plane part of the carrier surface and faces the service strip, connection areas of the supply conductors being in registration with the said flat contact area terminals of the device facing the service strip, and securing means securing the device against the service strip with the flat contact area terminals of the device in pressure contact with these connections areas of the supply conductors of the service strip.

2. An arrangement as claimed in claim 1, in which the service strip and the foil and carrier of the device are apertured to provide holes in the connection areas of the service strip in registration with holes in the flat contact area terminals of the device, and the said securing means pass from the said opposite face of the device through the said holes to the face of the service strip opposite the device to secure the device and its flat contact area terminals to the service strip.

3. An arrangement as claimed in claim 2, in which the said holes in the flat contact area terminals of the device are provided towards opposite ends of the device.

4. An arrangement as claimed in claim 2, in which the said securing means are rivets.

5. An arrangement as claimed in claim 4, in which the rivets have a snap-fit fastening.

6. An arrangement as claimed in claim 4, in which the rivets are hollow and form eyelets for the said holes.

7. An arrangement as claimed in claim 2, in which an insulating coating is present on the supply conductors of the service strip, and the said connection areas are present at exposed portions of the supply conductors at windows in the insulating coating.

8. An arrangement as claimed in claim 7, in which corresponding holes in the connections areas of the service strip are provided with eyelets through which the said securing means pass, and each of these service strip eyelets is in electrical connection with a supply conductor, provides the connection area of that supply conductor and is insulated from the other supply conductor or conductors of the service strip.

9. An arrangement as claimed in claim 8, in which the supply conductors are present at opposite major surfaces of the service strip, and one of the service strip eyelets forms an electrical feed-through from the major surface of the service strip facing the device to a supply conductor at the opposite major surface of the service strip.

10. An arrangement as claimed in claim 8, in which the rim of each service strip eyelet facing a flat contact area terminal of the device is substantially flat.

11. An arrangement as claimed in claim 8, in which a sealing ring is provided between the device and the service strip, around the rim of each service strip eyelet.

12. An arrangement as claimed in claim 1, in which the semiconductor device is a transistor, the carrier forms a collector connection to the major surface of the body secured thereto, and the foil includes emitter and base connection conductors which are connected to emitter and base electrodes at the opposite major surface of the semiconductor body.

13. An arrangement as claimed in claim 12, in which the two flat contact area terminals at the face of the transistor facing the service strip are emitter and base contact areas of the foil lead pattern, and the carrier has a collector terminal at the opposite face of the transistor.

14. An arrangement as claimed in claim 13, in which a securement hole in the emitter contact area of the foil has a different shape and/or size from that in the base contact area of the foil.

15. An arrangement as claimed in claim 13, in which the flat emitter contact area terminal is electrically connected to a main current supply conductor of the service strip and the flat base contact area terminal is electrically connected to a control conductor of the service strip for controlling the main current flow through the transistor between the emitter and collector terminals.

16. An arrangement as claimed in claim 12, in which part of the carrier is free of the foil and faces the service strip to provide a substantially flat collector contact area terminal of the transistor, and a terminal connector is secured through and insulated from the carrier, is in electrical connection with the emitter connection conductor of the foil at one major surface of the carrier and protrudes from the opposite major surface of the carrier to provide the emitter terminal of the transistor.

17. An arrangement as claimed in claim 16, in which the flat collector contact area terminal is electrically connected to a main current supply conductor of the service strip and the flat base contact area terminal is electrically connected to a control conductor of the service strip for controlling the main current flow through the transistor between the collector and emitter terminals.

18. An arrangement as claimed in claim 15, in which the service strip includes a plurality of control conductors and a common main-current supply conductor which extend in the longitudinal direction of the service strip, each control conductor having provision for electrical connection to the flat base contact area terminal of a transistor which is associated with this control conductor and which has its emitter and collector terminals connected between the common main-current supply conductor and a load whereby the current to each load can be controlled by a signal on the control conductor associated with the transistor connected to that load.

19. An arrangement as claimed in claim 18, in which the service strip is a wiring harness of a vehicle, at least one of the loads being an electric light of the vehicle.

* * * * *